(12) United States Patent
James et al.

(10) Patent No.: US 7,191,382 B2
(45) Date of Patent: Mar. 13, 2007

(54) METHODS AND APPARATUS FOR CORRECTING DATA AND ERROR DETECTION CODES ON THE FLY

(75) Inventors: Michael James, Longmont, CO (US); Kana Ono, Longmont, CO (US)

(73) Assignee: Fujitsu Limited, Kawasaki (JP)

( * ) Notice: Subject to any disclaimer, the term of this patent is extended or adjusted under 35 U.S.C. 154(b) by 690 days.

(21) Appl. No.: 10/452,603

(22) Filed: Jun. 2, 2003

(65) Prior Publication Data
US 2004/0243885 A1    Dec. 2, 2004

(51) Int. Cl.
*G11C 29/00* (2006.01)
(52) U.S. Cl. .................................... 714/769
(58) Field of Classification Search ............ 714/755, 714/763, 769, 773
See application file for complete search history.

(56) References Cited

U.S. PATENT DOCUMENTS 5,459,742 A * 10/1995 Cassidy et al. ............ 714/769
5,691,994 A * 11/1997 Acosta et al. ............. 714/784
5,696,775 A * 12/1997 Nemazie et al. ........... 714/805
6,048,090 A *  4/2000 Zook ....................... 714/755

* cited by examiner

*Primary Examiner*—Shelly Chase
(74) *Attorney, Agent, or Firm*—Greer, Burns & Crain, Ltd.

(57) ABSTRACT

When data is read from a disk and stored in volatile memory, check bits are generated and stored in the memory using an algorithm such as cyclical redundancy check (CRC). The CRC algorithm operates on the basis of the bit length in which the data is organized, such as 8 bits. If the data has errors, an error correction code (ECC) algorithm is used to correct the data errors, but the ECC algorithm operates on the basis of symbols having a different bit length, such as 10 bits. To avoid having to re-read the data from the volatile memory to adjust the CRC value, the CRC algorithm is executed on selected mask data developed by the ECC algorithm, the CRC algorithm being executed on the basis of the second bit length to generate a CRC mask. The CRC mask corrects the stored CRC value.

12 Claims, 12 Drawing Sheets

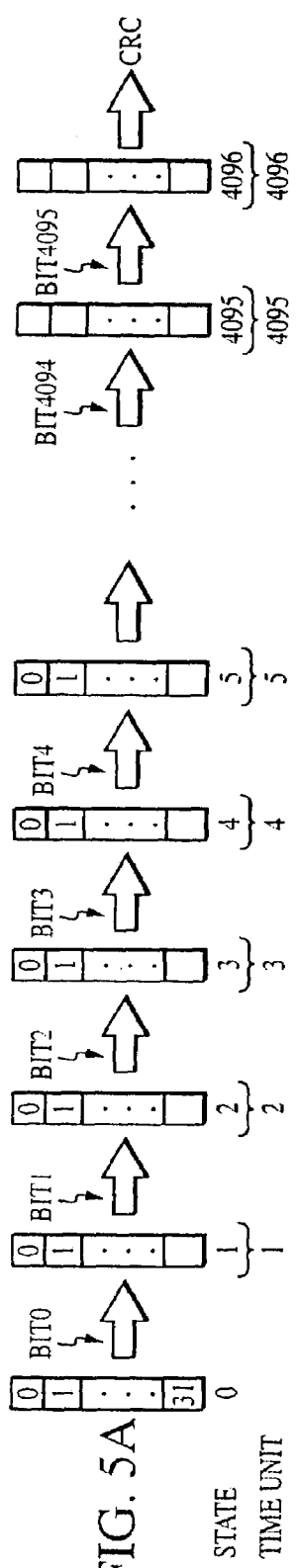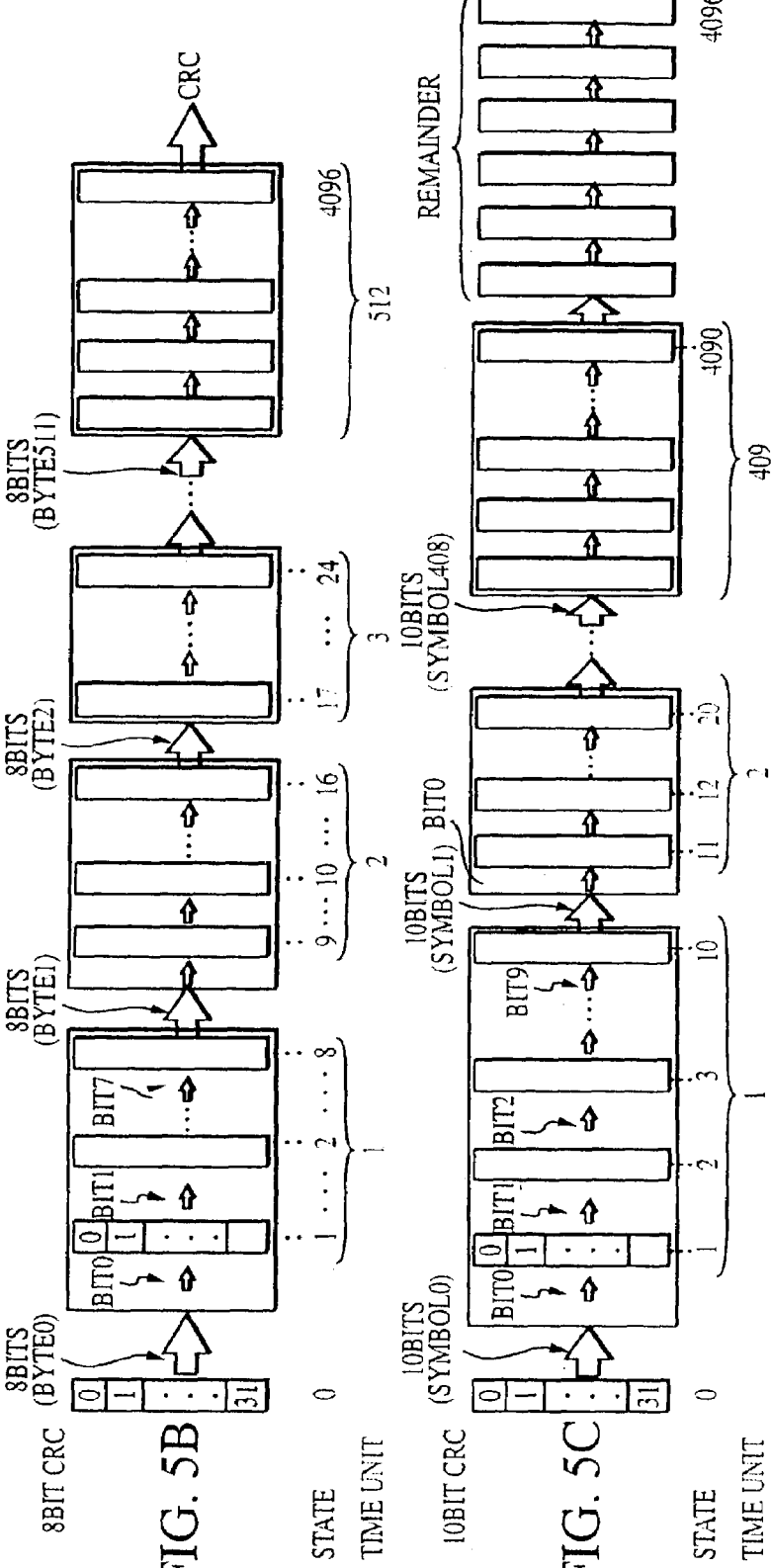
FIG. 5A    FIG. 5B    FIG. 5C

METHODS AND APPARATUS FOR CORRECTING DATA AND ERROR DETECTION CODES ON THE FLY

This invention relates to methods and apparatus for detecting and correcting data errors, and more particularly, to methods and apparatus for correcting data errors and data error detection codes such as cyclical redundancy check (CRC) values on the fly, without requiring re-reading of data.

BACKGROUND OF THE INVENTION

In modern computer systems, data is constantly written to and read front several memory devices. One such device is a disk drive. While disk drives are used for permanent or non-volatile data storage on a magnetic or optical disk, they typically use internal volatile memory such as SDRAM to stage data before writing data to the disk. The SDRAM is also used to stage data after reading it from the disk, before it is sent to the host. However, every staging operation in the SDRAM creates an opportunity for error, both from the host to the disk and from the disk to the host. As a result, some method of error detection (and sometimes correction) must be employed every time data is transferred, even within the disk drive.

In the disk drives just described, when the data is received from the host and written to the staging memory, error detection capability is typically added. A relatively simple, low overhead algorithm such as Cyclical Redundancy Check (CRC) can determine whether there are any errors in the data. As the data is written to the staging memory, the CRC algorithm adds some check bits to the data that allow for detection of errors when the data is read at a later time. At a desired time, the data is read from the staging memory and sent to the disk.

As the data is read from the staging memory, the CRC algorithm reads the data and the check bits to determine whether there are any errors in the data. If there are errors, the data is re-requested from the host and the process is repeated, until the data is transferred to the disk without errors. The CRC algorithm need not correct errors, however, because if there are errors, the data can be re-requested from the host until the data transfer is successfully completed without errors. Thus, it is not necessary for the CRC algorithm to identify or correct errors at this stage. The CRC algorithm merely determines whether any errors exist in the data.

The data is also checked for errors when it is sent through the staging memory in the other direction, i.e., from the disk to the host. Thus, when the data is received from the disk and the data is written to the staging memory, the CRC algorithm adds CRC check bits to the data. When the data is read from the staging memory, the CRC algorithm checks the data and CRC bits to determine whether there are errors. In the case of an error, the data is re-requested from the disk and the operation repeats until the data is successfully transferred without errors.

Insuring the integrity of the data stored on the disk requires a more complex error correction algorithm. If the data stored on the disk has errors, the errors must be identified and corrected without rereading the data, because the errors are likely stored on the disk and the data is presumably not available from the host or another source. In this case, a more sophisticated algorithm must be used that can identify the errors and correct them.

Error identification and correction requires more complex, relatively high overhead algorithms. Such algorithms produce data strings, commonly called Error Correction Codes (ECCs), that are stored on the disk with the data. When the data is read from the disk, it is checked against the ECC's, and if errors are detected, most of the errors can be identified and corrected. Some ECC implementations use a Cyclical Redundancy Check algorithm that verifies that the errors have been corrected, as desired.

Data is generally written to and read out of the disk in sectors containing some number of bytes, such as 512 bytes, or 4096 bits. As the first sector is read from the disk, it is immediately written to the staging memory. At the same time, the ECC algorithm is executed, and a CRC value is calculated. If an error is found by the ECC algorithm, mask data is generated that specifies which bytes in the SDRAM should be corrected. Then, the erroneous bytes are read from the SDRAM and XORed with the mask data and written back to the SDRAM. The CRC mask is calculated using the mask data from the ECC algorithm. In this manner, the data and CRC value can be corrected without re-reading the whole sector from the SDRAM.

In the past, a typical disk drive used a single bit length or symbol length for data and for its ECC algorithm. Recently, however, ECC algorithms using 10 bit symbols have been adopted, even though the host still communicates in 8 bit symbols, the staging memories store data based on 8 bit symbols, and the CRC algorithm is also based on those 8 bit symbols. This is a problem because the mask segments created by the ECC algorithm do not directly correspond to or lie over the data bytes, so the CRC value cannot merely be calculated according to the ECC mask layout to complete the correction process.

The CRC values could be recalculated by re-reading the whole corrected sector from the SDRAM, but that process would be time consuming, and would slow the operation of the drive. Thus, there is a need for methods and apparatus for correcting data and error detection codes on the fly, without reading the data after it has been corrected.

Another problem encountered when the ECC algorithm processes the data in symbols having a different size than the symbols in which the data is organized is that if the ECC bit symbols cannot divide evenly into the number of bits in the sectors, the remainder is difficult to process. If the sector has 4,096 bits, for example, an algorithm that uses 10 bit symbols for processing purposes will process 409 symbols, and have 6 bits remaining. The CRC calculation fails because it is based on 4090 bits or 4100 bits, not 4096 bits. Thus, there is a need for methods and apparatus for correcting the CRC calculations, irrespective of whether the symbol length of a correction algorithm is evenly divisible into the number of bits in a sector.

If a disk drive controller operates on the basis of a single sector size, the control can only be used for that sector size. This limits the flexibility of the controller. Thus, there is a need for methods and apparatus for detecting errors in data, regardless of the sector size.

SUMMARY OF THE INVENTION

In keeping with one aspect of this invention, data and error detection codes such as cyclical redundancy check (CRC) values (or check bits) are corrected on the fly, without slowing data reading operations. In a data reading operation, for example, a first sector is read from a disk and stored in volatile memory. Error detection values generated by a CRC algorithm are also stored in the volatile memory.

The data is organized in symbols each having some number of bits, and the CRC algorithm is executed on the basis of the symbol size of the data, to produce a CRC value having some number of bits. The stored CRC values can be used later to identify that errors have occurred, but the CRC algorithm cannot readily correct the errors. To correct errors, a more complex algorithm such as an ECC algorithm is executed.

The ECC algorithm is executed on the first sector while a second sector is being read from the disk, to speed operation of the drive. When errors are found, both the data and the CRC value indicating the errors are corrected, without re-reading the first sector, even if the data is organized in symbols having one bit length and the ECC algorithm operates on the basis of symbols having a different symbol size. In one embodiment, the ECC algorithm generates ECC mask data that identifies the locations of the erroneous data. The erroneous data is corrected by performing an exclusive OR (XOR) operation on the erroneous data segments and the mask data. A CRC mask value is also generated from the ECC mask. The CRC mask value has the same number of bits as the first CRC value, but this time the CRC algorithm is executed on the basis of the symbol size of the ECC algorithm. An XOR operation is performed on the CRC value obtained from the erroneous data and the CRC mask value obtained from the ECC mask, which produces a correct CRC value for the corrected data. The correct CRC values are then stored in the volatile memory with the corrected data. When the data is read from the SDRAM and sent to the host, the CRC algorithm uses the data and stored CRC value to validate that the data has no errors.

BRIEF DESCRIPTION OF THE DRAWINGS

The above mentioned and other features of this invention and the manner of obtaining them will become more apparent, and the invention itself will be best understood by reference to the following description of an embodiment of the invention taken in conjunction with the accompanying drawings, in which:

FIG. 5A is a diagram illustrating CRC generation performed on a 1 bit basis;

FIG. 5B is a diagram illustrating CRC generation performed on an 8 bit basis;

FIG. 5C is a diagram illustrating CRC generation performed on a 10 bit basis;

DETAILED DESCRIPTION

Figure 1:
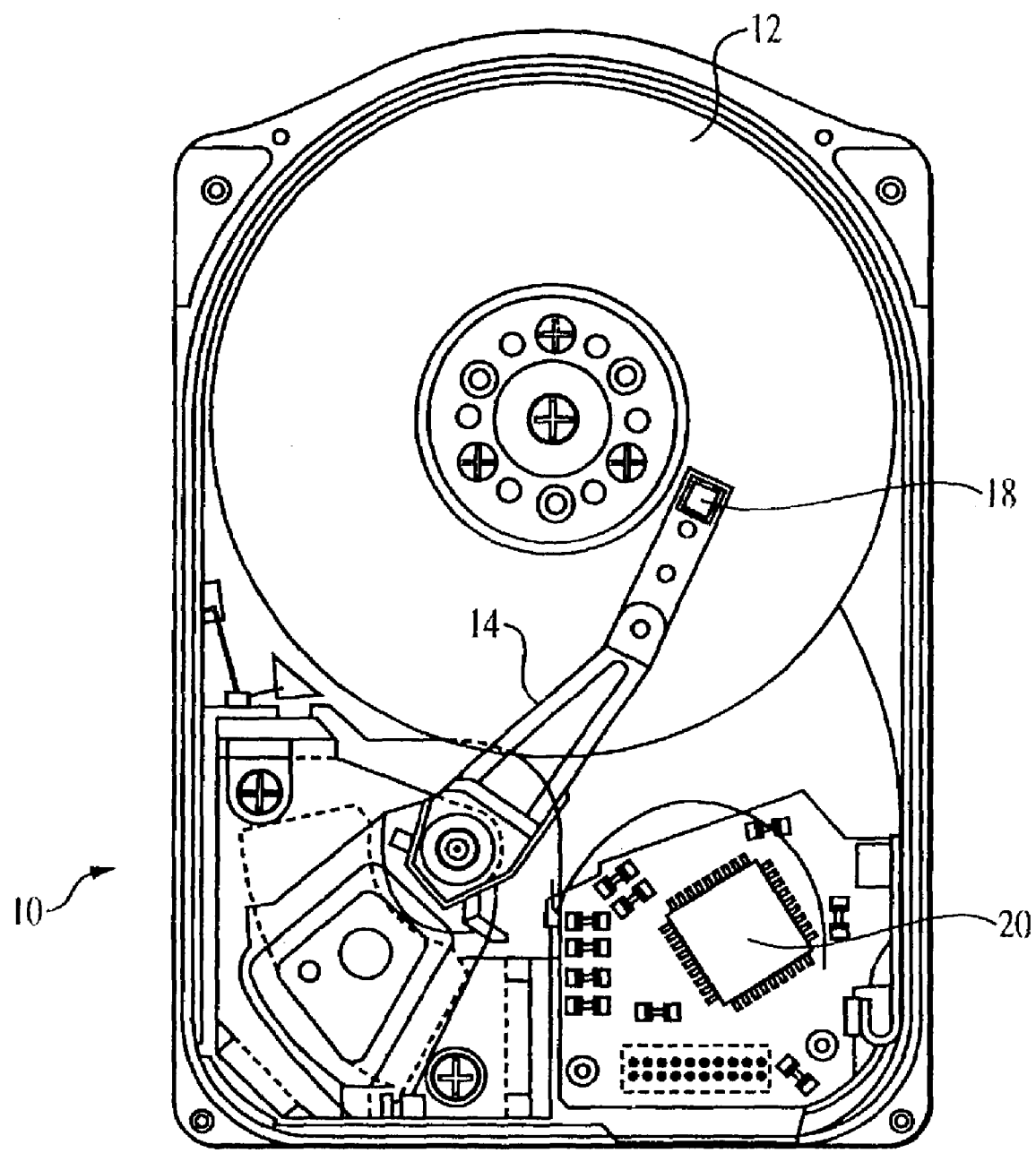
FIG. 1 is a plan view of a disk drive made in accordance with the present invention.

As seen in FIG. 1, a typical magnetic disk drive 10 includes a magnetic disk 12, a spindle motor (not shown) that rotates the disk at a desired speed, and a head arm 14 that pivots to move a recording/reproducing head 18 back and forth across the disk as the disk rotates. The head 18 can have a single head for both reading and writing, or separate heads for reading and writing. A controller 20 is also provided.

The magnetic disk drive 10 could also be an optical or magneto-optical drive or the like, a tape drive or the like, or simply a communication system. The disk 12 could be any suitable media, such as an optical or magneto-optical disk or the like, tape or the like, or a communication channel. These devices also have at least one head or the like, and a suitable controller.

Figure 2:
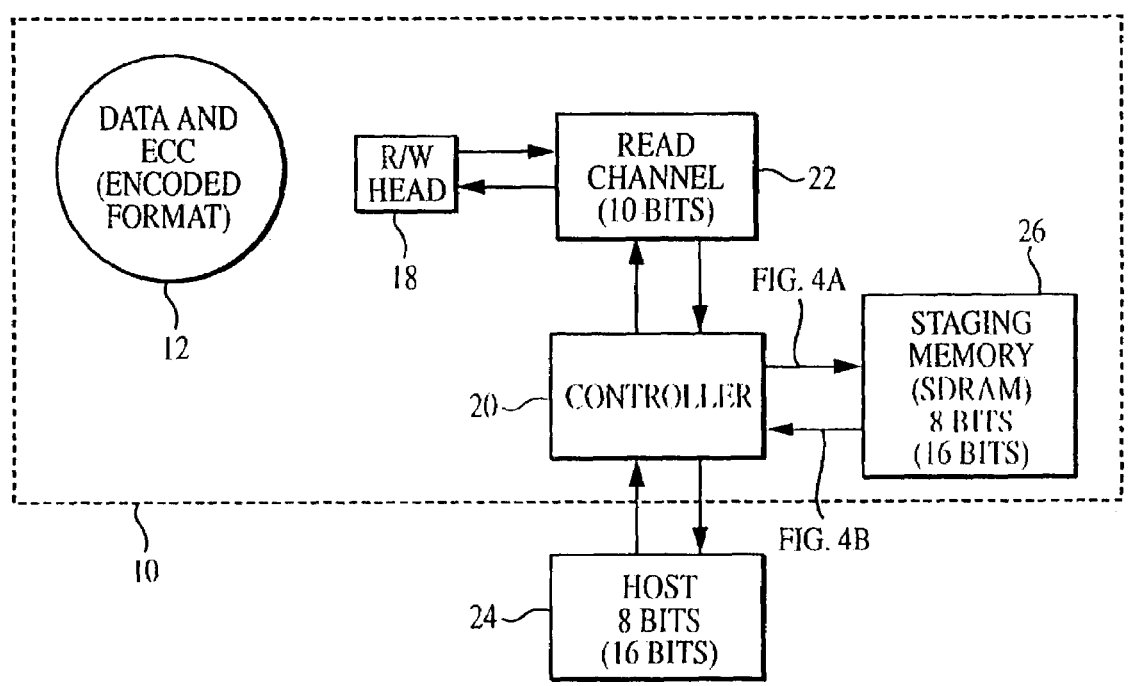
FIG. 2 is a block diagram of the disk drive of FIG. 1.

The head 18 writes data to and reads data from the disk 12 with the general circuit configuration shown in FIG. 2. The controller 20 controls the reading and writing operations of the head 18. The controller 20 also provides data to the write head and receives data from the read head through a read channel 22. The read channel processes the data on the basis of a predetermined symbol size, such as 10 bits.

The controller responds to read and write commands from a host 24, such as a PC or other computer. The host 24 also sends data to the disk drive 10 through the controller 20, and receives data from the disk drive 10 through the controller 20. However, the host 24 processes data on the basis of a different predetermined symbol size, such as one or two 8-bit bytes.

Figure 4A:
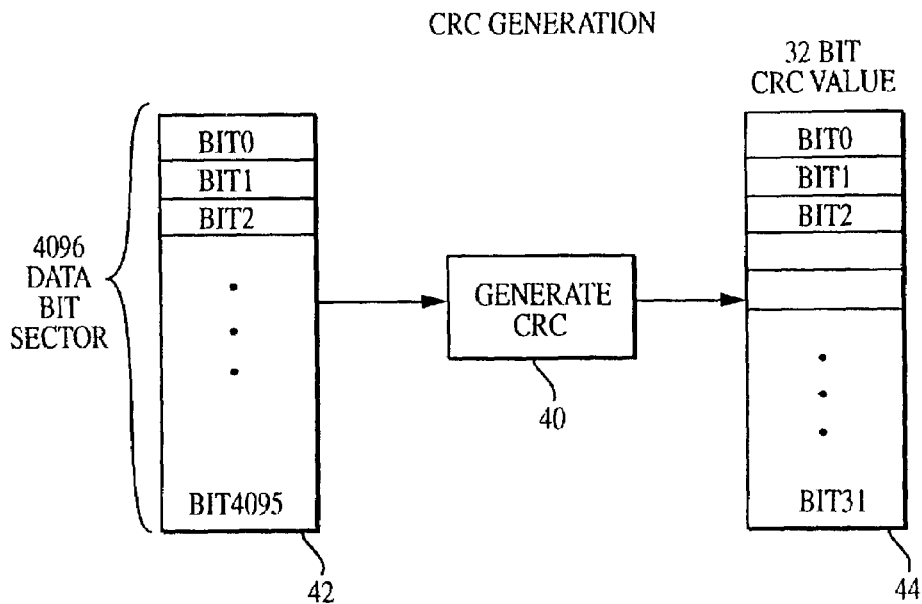
FIG. 4A is an illustration that describes error detection code generation using a cyclical redundancy check algorithm.

In order to facilitate operations of the disk drive 10, a volatile staging memory 26 such as a static dynamic random access memory (SDRAM) or any other suitable memory is operatively connected to the controller 20. The staging memory 26 processes data on the basis of the symbol size used by the host 24, such as one or two bytes (8 or 16 bits). When data is received from the host 24, the controller 20 stages the data in the memory 26 (see FIG. 4A) and writes the data from the memory 26 to the disk 12 (FIG. 4B) as desired. When the controller 20 receives a read command from the host 24, data that includes the requested data is read from the disk 12 as needed, and is assembled in the memory 26 (FIG. 4A). When the data is assembled, it is read from the memory 26 (FIG. 4B) and sent to the host 24 through the controller 20.

Figure 3:
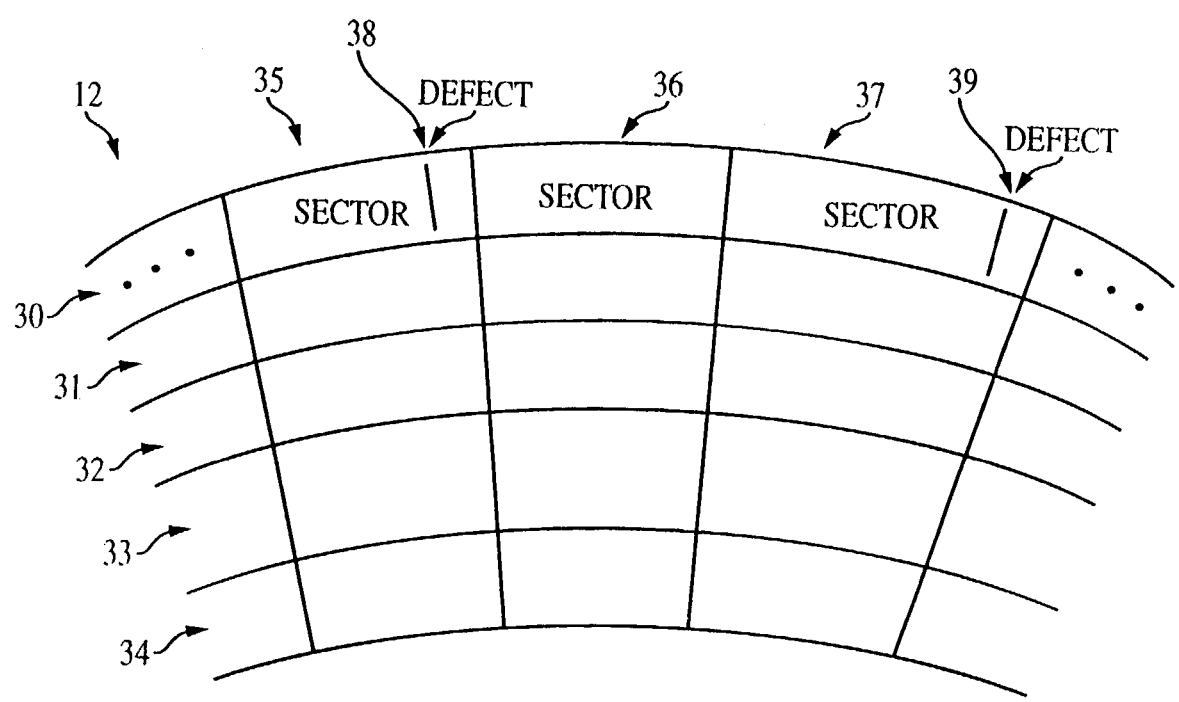
FIG. 3 is a diagram of a portion of the disk in the drive of FIG. 1.

Data is stored on the disk 12 on circumferential tracks 30, 31, 32, 33, 34 etc., as seen in FIG. 3. For data processing purposes, the data is organized in symbols (not shown) typically having 8 or 10 bits each. The symbols are organized in sectors 35, 36, 37, etc., which each typically include 4096 bits. However, the number of bits in a sector can vary for various reasons.

When data in a particular track and sector is requested, the controller 20 directs the head 18 to the desired sector, and typically reads the entire sector, even though the sector might or might not be full. Of course, during the writing operation, the controller 20 finds sectors that can accept data, and directs the write head to the proper track and sector, where the data is written to the disk. In FIG. 3, the first sector in track 30 has a data error 38, and the sector 37 has an error 39.

Errors can be produced at any stage during the reading and writing processes. Several methods for detecting and/or correcting errors in the data are available. One popular approach to error detection, without correction, is a cyclical redundancy check (CRC). In the CRC method, CRC values (check bits) are generated in the manner illustrated in FIG. 4A, and the CRC values are checked in the manner shown in FIG. 4B.

Referring now to FIG. 2 and FIG. 4A, the controller 20 or other circuit is programmed to generate CRC values at a step 40, typically a sector at a time, when the sector 42 is written to the SDRAM. The CRC algorithm generates a CRC value 44 for each sector. While the CRC value itself can be any size, a typical CRC value 44 has 32 bits.

Figure 4B:
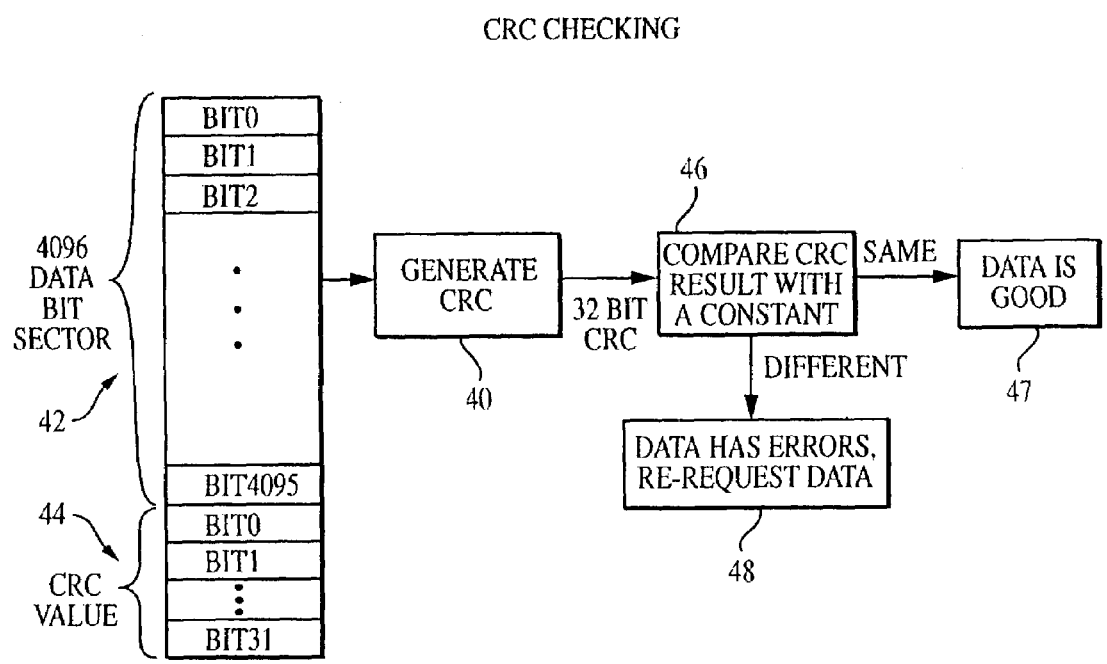
FIG. 4B is an illustration that describes error detection code verification using a cyclical redundancy check algorithm.

The CRC checking operation is shown in FIG. 4B. The sector 42 and CRC value 44 are read from the SDRAM and processed through a CRC generation algorithm at step 40. The CRC result is compared with a constant or expected value at step 46, and if the CRC result is the same as the constant, then the presence of errors is not detected, at a step 47. If errors are found, the data is re-requested, at step 48. If there are no CRC errors, the data is released to the disk or host, as commanded.

The CRC algorithm can operate on the basis of a variety of symbol sizes, such as the 1 bit, 8 bit and 10 bit symbol sizes described here as examples, as seen in FIGS. 5A, 5B and 5C. In FIG. 5A, an initial 32 bit CRC check bit value is established for state 0. A CRC calculation is made on bit 0, generating a new CRC value in state 1. The algorithm is executed on bit 1, generating a CRC value in state 2, etc., until a final CRC value is calculated in state 4096. Since the CRC algorithm operates one bit at a time, each calculation takes one time unit to complete. Thus, in FIG. 5A, the CRC generation is complete after 4,096 time units.

In FIG. 5B, an initial 32 bit CRC value is established in state 0, but the algorithm is executed on 8 bits at a time, in a cascaded manner, so that the CRC algorithm is executed on the first 8 bits in one time unit. By executing the algorithm in 8 bit segments, only 512 time units are required to process the 4,096 bits.

In FIG. 5C, an initial 32 bit CRC value is established in state 0, and CRC values for the first 10 bits are calculated in a cascaded manner in a time unit 1. By cascading the calculations in units of 10 bits, only 409 time units are required to calculate a CRC value for 4,090 bits. The CRC value can be generated for the remaining 6 bits, one bit at a time, two bits at a time, etc., as desired.

Figure 6A:
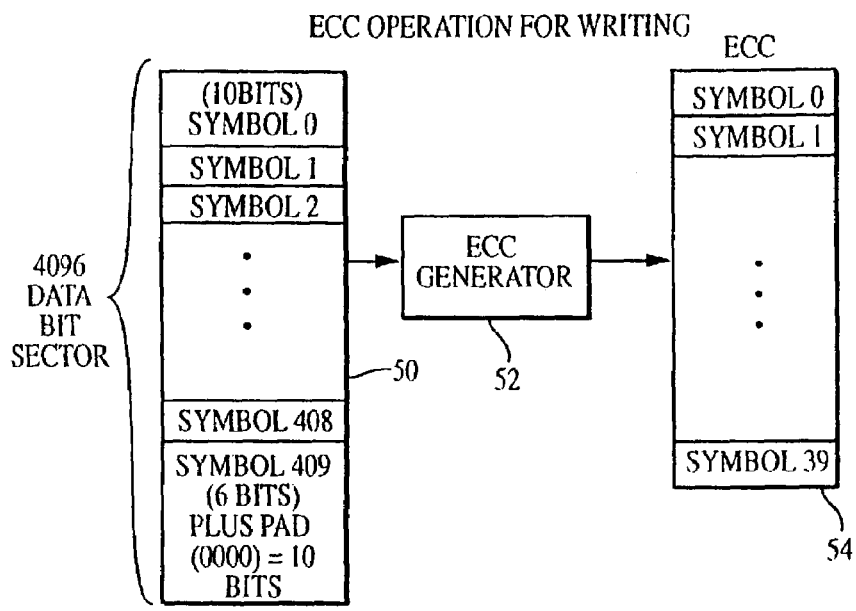
FIG. 6A is an illustration describing data processing used by an error correction algorithm when writing data.

A popular method for error identification and correction uses a relatively complex algorithm in which data strings are produced and stored on the disk with the data. The data strings are commonly called error correction codes (ECCs). While the data strings could be any number of bits in length, typical error correction codes are generated by the controller 20 or other device by dividing the bits in a sector into 10 bit symbols, as seen in FIG. 6A. A 4,096 bit sector 50 is divided into 10 bit symbols 0, 1, 2, . . . 408. In a sector having 4,096 bits, 4090 bits are divided into 409 symbols, and the last 6 bits are placed in a symbol 409. A 4 bit pad (e.g., 0000) is added to that symbol to give it 10 bits.

Before or as the data is written to the disk 12, the controller 20 uses a generally available algorithm at step 52, to generate 10 bit ECC symbols 54, including symbols 0, 1, . . . 39, for example, or any other desirable number of symbols. The ECC symbols 54 are recorded on the disk with the data in the sector 50.

Figure 6B:
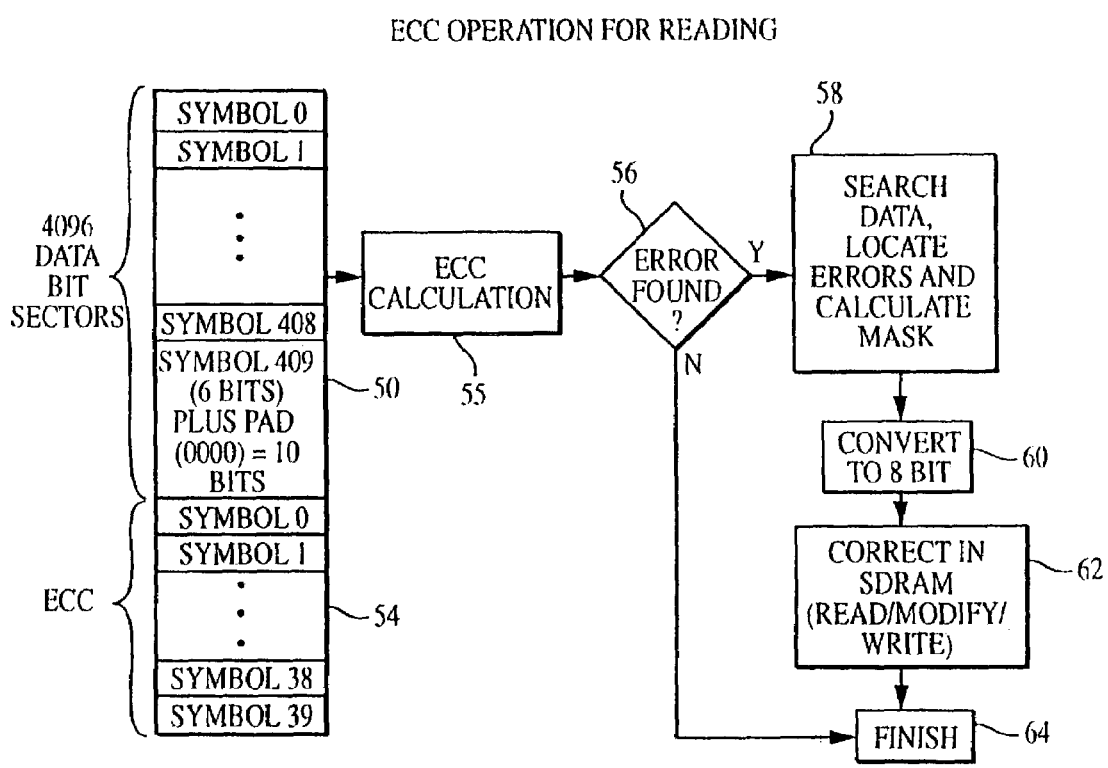
FIG. 6B is an illustration describing the error correction process when reading data.

The reading operation is illustrated in FIG. 6B. The sector 50 and ECC symbols 54 are read from the disk, and an ECC calculation is performed by the controller 20 or other device at a step 55. The ECC calculation uses the data and ECC symbols to determine whether there are errors. If errors are found in step 56, the ECC symbols 54 are used to identify the data errors and correct them. The error locations and masks are identified in step 58. The 10 bit symbol locations in the mask are correlated with the 8 bit symbol locations into which the data is organized at step 60, and the data is corrected in the staging memory in step 62 using a read/modify/write process, as will be described. When the errors are corrected, the data values are correct in the SDRAM, and the ECC correction operation is finished at step 64.

Figure 7:
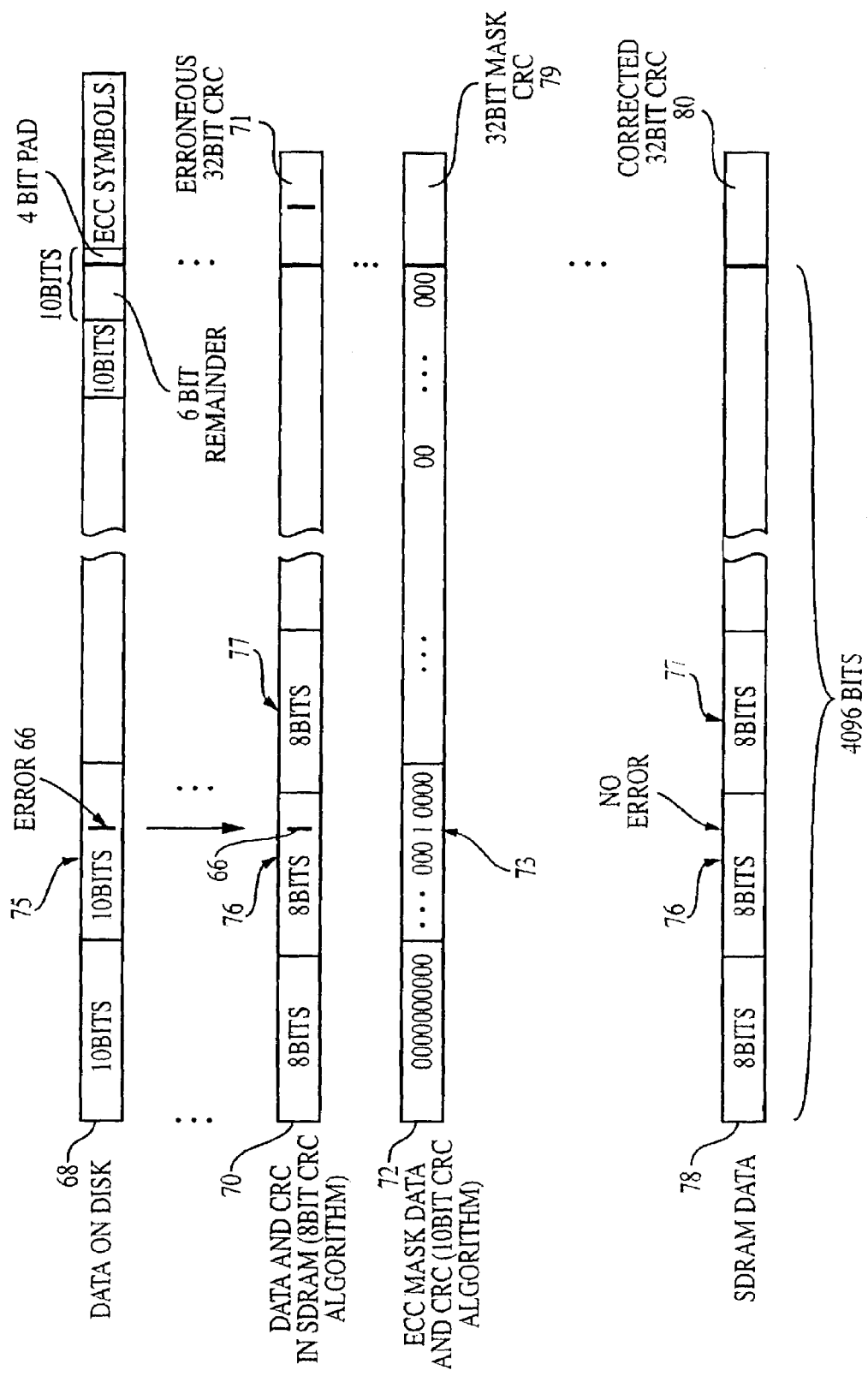
FIG. 7 is a diagram showing how mask segments are identified for error correction purposes.

The error/mask location data search is shown in greater detail in FIG. 7. Assuming 4,096 bits in a sector, with an error in data bit 66, the data on the disk, organized in 10 bit ECC symbols, is shown in line 68. The data organization scheme includes the 10 bit symbols used for the ECC algorithm, including a 6 bit remainder and a 4 bit pad that completes the last symbol. The data bits are followed by the recorded ECC symbols.

The same data is stored in the SDRAM, divided into 8 bit symbols, followed by the CRC value generated while writing the data from the disk to the SDRAM, as seen in line 70. The SDRAM data includes the error 66, and a CRC value 71 that correctly reflects the error 66, but is considered erroneous in this context due to the error 66. The CRC value 71 in this embodiment is a 32 bit value generated on the basis of an eight bit symbol.

From the data and ECC symbols in line 68, a mask is generated for each bit by the ECC algorithm, as seen in line 72. If there are no errors, the ECC algorithm will record all zeros in this example. If there is an error, however, as at bit 66, the mask will generate a one at bit 73.

The error 66 can be easily corrected with the ECC algorithm. In fact, the bit 66 can be corrected without re-reading the data from the disk with this method, because the error is corrected through the ECC algorithm. In this manner, data errors are corrected on the fly.

The erroneous CRC value 71 must also be corrected. The erroneous CRC value could be corrected by re-reading the whole sector from SDRAM after the data correction process, but that is time consuming and inconvenient, as will be seen. For this reason, it is desirable to correct the erroneous CRC value 71 on the fly, as well.

Figure 8:
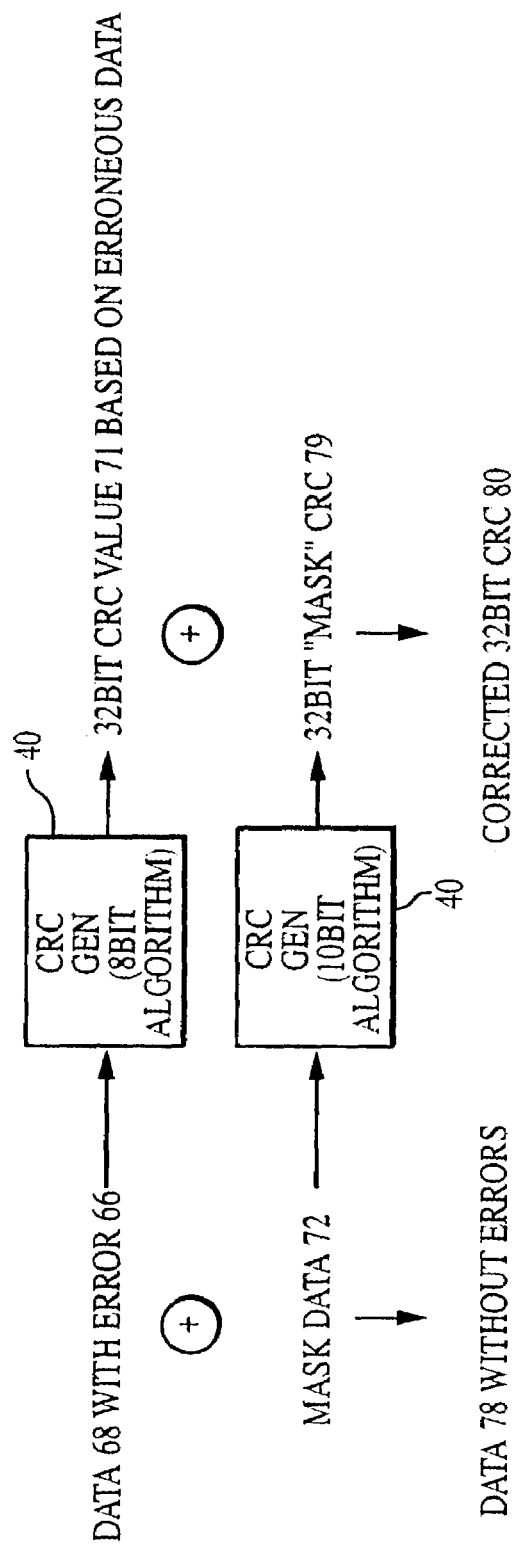
FIG. 8 is a diagram describing a method by which data and CRC values can be corrected on the fly, without re-reading data.

The erroneous CRC value 71 can be corrected on the fly in the manner shown in FIG. 8, as well as FIG. 7. The data 68, including the error 66, is processed through a CRC algorithm at step 40, generating the CRC value 71 while writing to the SDRAM. The CRC value 71 is considered erroneous because it is calculated with the error 66.

The mask data 72 developed from the mask segment for data bytes 76, 77 includes the mask data bit 73, corresponding to the erroneous data bit 66. The mask segments in the mask data are subjected to an XOR operation with the data bytes 76 and 77 (with the error 66), which corrects the error 66 in the data 68, as seen in line 78 of FIG. 7.

The mask data 72 is also passed through the CRC generator 40, after the error is identified, and a mask CRC value 79 is generated. The CRC value 79 is also a 32 bit value, but it is generated on the basis of 10 bit symbols, as will be explained. The error CRC 71 is subjected to an XOR operation with the mask CRC 79, generating a 32 bit corrected CRC value 80, also seen in line 78 in FIG. 7.

Referring now to FIG. 8, the data 68 with the error 66 and the mask data 72 are processed bit by bit through an XOR operation, creating data 78 that does not have errors. The erroneous CRC value 71 and the mask CRC 79 are also processed bit by bit through an XOR operation, which generates the corrected CRC value 80. In this manner, both the data error and the CRC error generated by that data error are corrected, without re-reading the data.

Figure 9:
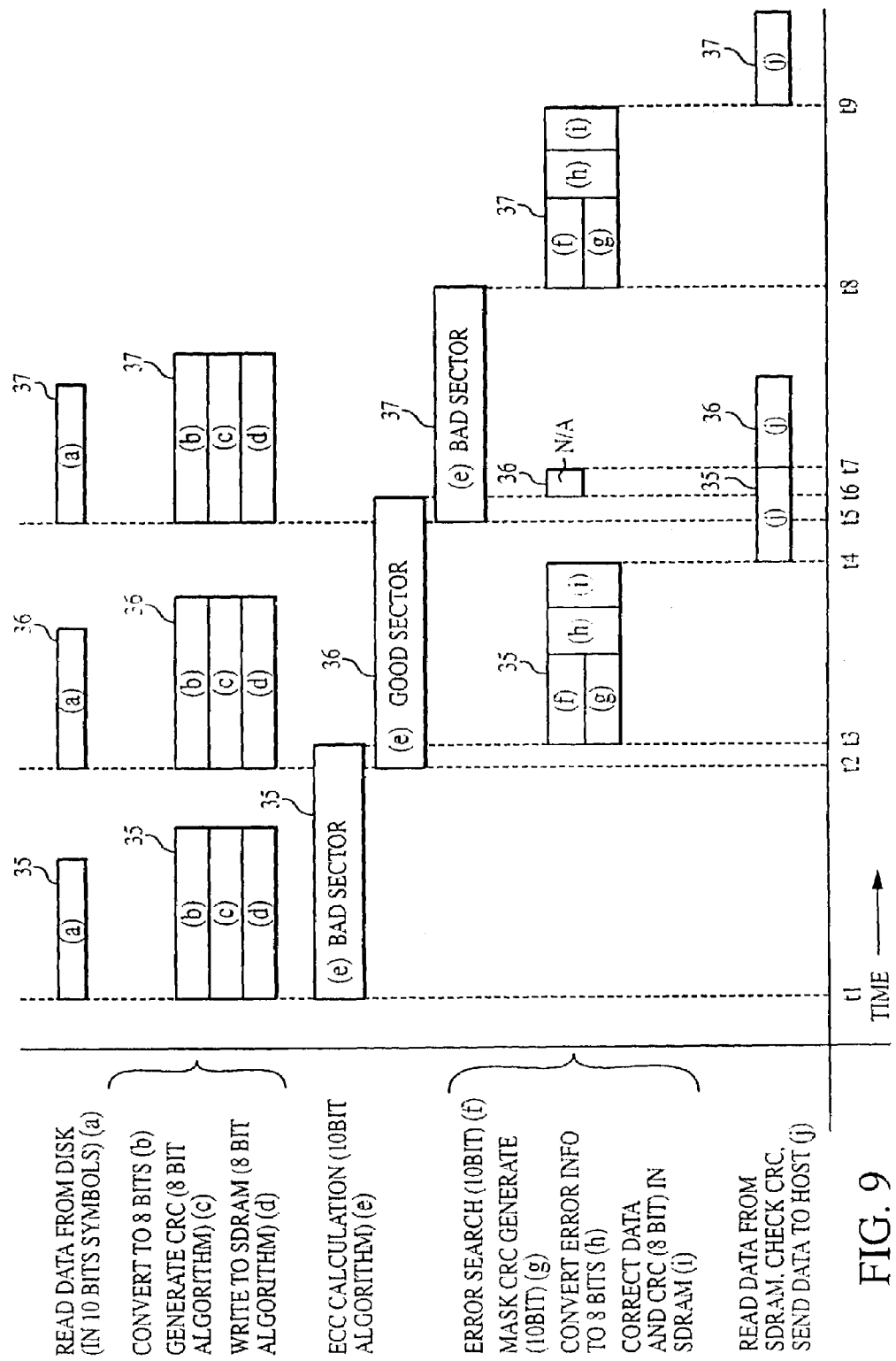
FIG. 9 is a diagram showing the process by which data is read from a disk and errors are detected, identified and corrected.

The importance of correcting the CRC value and data on the fly can be better understood with reference to FIG. 9.

Sectors 35, 36 and 37 are read sequentially from a selected track on the disk in step (a), starting at times t1, t2 and t5, respectively, and the sectors read from the disk are written to the SDRAM or other memory 26. The data is stored on the disk in a 10 bit symbol format, as previously described.

As the data is read from the disk, it is converted to an 8 bit format in step (b), also starting at times t1, t2 and t5. CRC values are generated in step (c) and the data is written to the memory 26 in step (d). The bit length conversion and CRC generation take very little time, so all three steps occur virtually simultaneously as data is read from the disk.

The ECC calculation begins in step (e) as each sector is read, starting at times t1, t2 and t5, but that takes more time than the CRC generation (times t3, t6 and t8, respectively) and cannot be completed before the next sector is read from the disk, because the disk rotates very quickly. Thus, for example, sector 36 is read from time t2, but the ECC calculations on sector 35 are not finished until time t3. If an error is discovered during the ECC calculation for a sector such as sector 35 (step e), the error is identified using a search algorithm in step 35 (f) (starting at time t3) based on the 10 bit ECC format, and the mask CRC value is generated at step (g) from the 10 bit ECC mask values identified in step (f). Step (f) and step (g) are performed in parallel. Then, the mask is converted to the 8 bit format in step (h). Finally, the data error and CRC value are corrected in the SDRAM in step (i), and those processes are completed at time t4. The data can then be read from the SDRAM in step (j).

The CRC is checked as the data is sent to the host, and the process is completed if there are no errors. If there are errors, the data is re-requested from the disk. As seen in FIG. 9, however, the correction in sector 35 is not completed before at least one other sector (sector 36, for example) is at least partially read from the disk.

The data error and CRC error in sector 35 are corrected on the fly through the error search, CRC mask generation and error correction process, previously described during the time that sector 36 is read. Of course, if there are no errors, as with sector 36 in FIG. 9, error correction in steps (f), (g), (h) and (i) is not needed (N/A) and the data can be simply sent to the host in step (j) at time t7, following the completion of step (j) for sector 35 with the CRC check performed as previously described. Errors in sector 37 are corrected in a manner similar to the manner in which the errors in sector 35 are corrected, from time t5 to time t9.

The value of correcting errors on the fly, without re-reading data, can now be better understood. If sector 35 had to be re-read from the SDRAM to recalculate the CRC value, the entire process would slow down.

Figure 10:
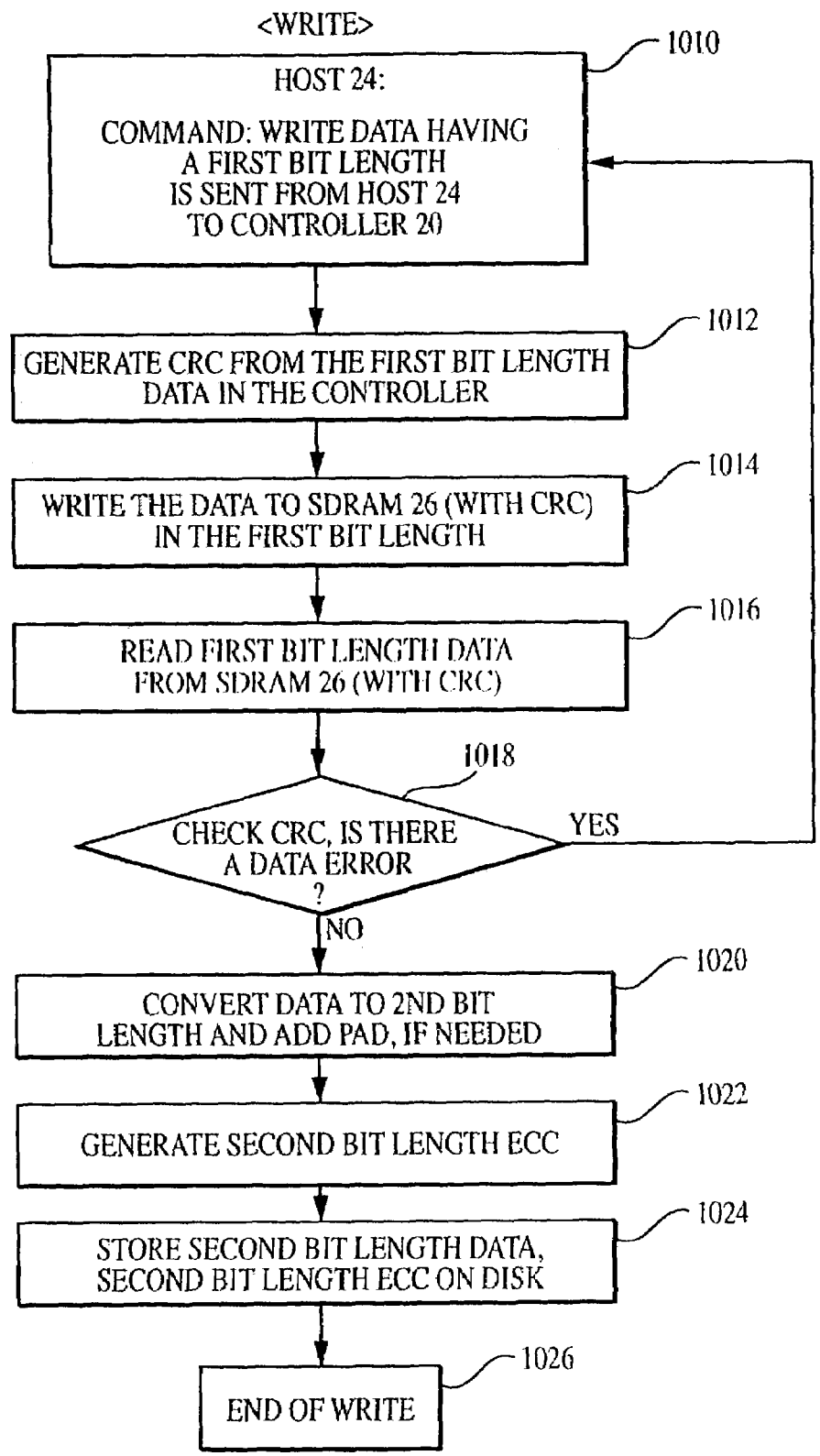
FIG. 10 is a flow chart describing the write process used by the disk drive of FIG. 1.

The write process is described in more detail in FIG. 10. When the host 24 issues a write command to the controller 20 in step 1010, CRC codes are generated from the first bit length data in step 1012, and the data is written to the SDRAM 26 with the CRC codes, in step 1014 (see FIG. 4A).

The first bit length data is read from the SDRAM 26 with the CRC codes at step 1016. As the data is read from the SDRAM 26, the CRC codes are checked (see FIG. 4B), and if an error is discovered, the controller 20 returns to the host and has the data read again, stored in the SDRAM 26, and then read from the SDRAM 26 at step 1018.

If no data errors are identified, the data is processed by an error correction code algorithm in the controller 20. The data is converted to the second bit length and a pad is added at step 1020, and ECC codes are generated at step 1022. The data (now organized according to the second bit length) and the ECC codes (which are based on the second bit length) are stored on the disk 12 at step 1024. The write process is completed at step 1026.

Figure 11:
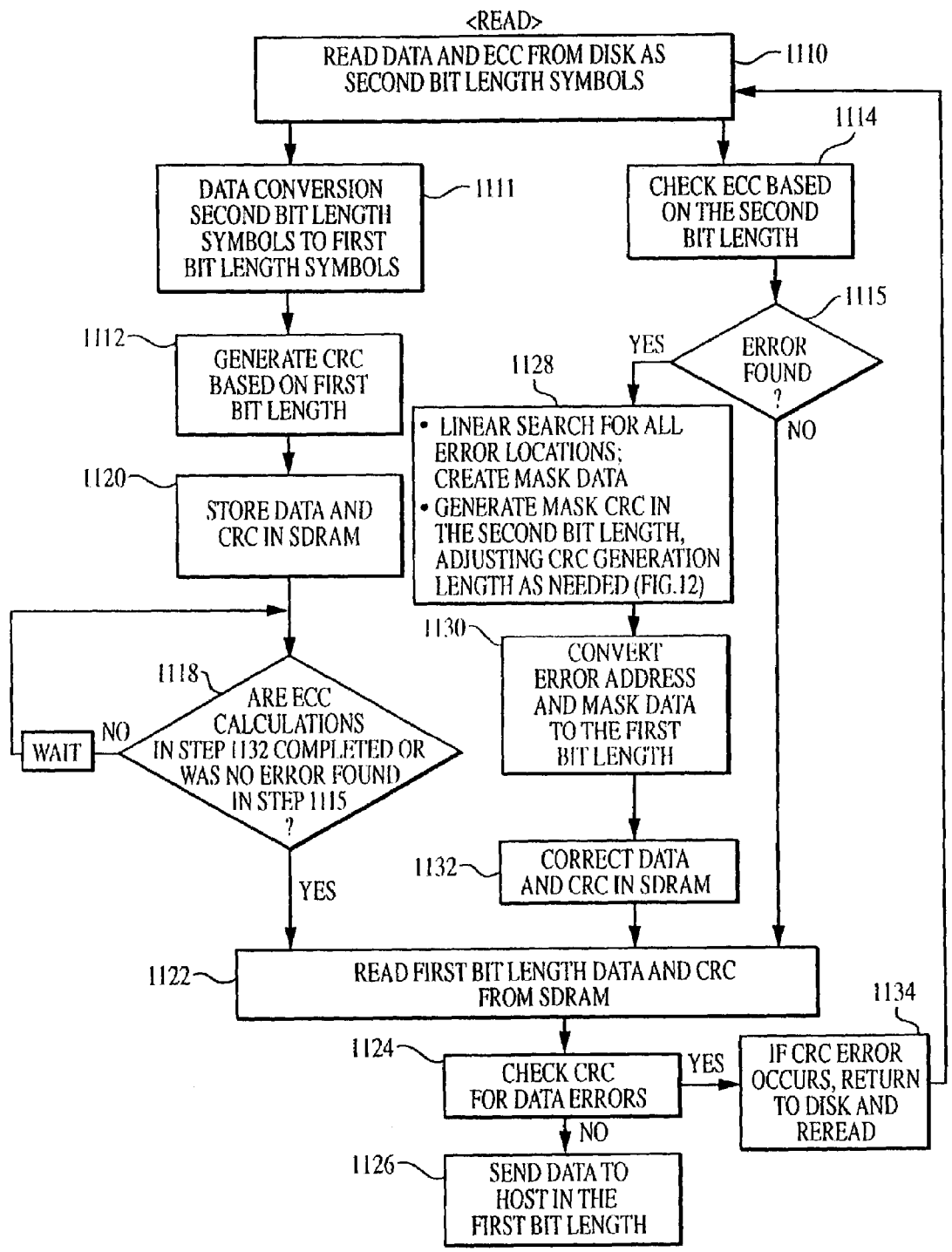
FIG. 11 is a flow chart describing the read process used by the disk drive of FIG. 1.

The read process is described in more detail in FIG. 11. When the controller receives a read command, the controller identifies the sectors which must be read from the disk 12 to satisfy the command, and instructs the head 18 to read those sectors. The data is read with its related ECC codes at step 1110, and is converted from second bit length symbol format to first bit length symbol format at step 1111. A CRC value is generated based on the first bit length at step 1112, and the data and CRC value generated at step 1112 are written to the SDRAM 26 at step 1120. This process is similarly described in connection with FIG. 4A.

In the same time frame, the data is processed using the ECC codes, based on the second bit length, at step 1114. If errors are or are not found, subsequent processing is determined at step 1115.

If no errors are found by the ECC algorithm at step 1115, the controller reads the first bit length data and CRC value from the SDRAM at step 1122, and checks the newly generated CRC value against the previously generated CRC value at step 1124. This process is similarly described in connection with FIG. 4A.

If no errors are found in step 1124, the data is sent to the host 24 at step 1126. If errors are found at step 1124, the controller returns to step 1110 and re-reads the data, through step 1134.

If one or more errors are found at step 1115, an error search occurs at step 1128. During this search, the CRC mask is generated based on the second bit length, as described earlier in connection with steps (f) and (g) in FIG. 9. Further explanation of CRC generation based on the second bit length will be given in connection with FIG. 12. Once the mask locations are known, the mask segments are mapped to corresponding first bit length symbols at step 1130, as previously described. The data and CRC values are corrected in the manner previously described, at step 1132. The first bit length data and CRC value are read from the SDRAM 26 in step 1122, and the process continues as previously described. In this manner, the data is read, modified and re-written to correct errors and calculate the CRC values.

In step 1118, the controller determines whether no errors were detected (in step 1115), or whether errors were found and corrected (step 1132). If either answer is yes, the process continues to step 1122. If not, the controller waits for a positive response from step 1115 or 1132.

CRC generation based on the second bit length will now be described in greater detail. If the second bit length is not evenly divisible into the total number of bits, then a remainder will be left after all but the last bits are processed. For example, in the case of the first bit length data having 512 8-bit bytes, there are 4096 total bits. If the second bit length is 10 bits, then 4090 bits will be processed in 409 10 bit symbols. The remaining 6 bits will be processed on the following basis.

Figure 12:
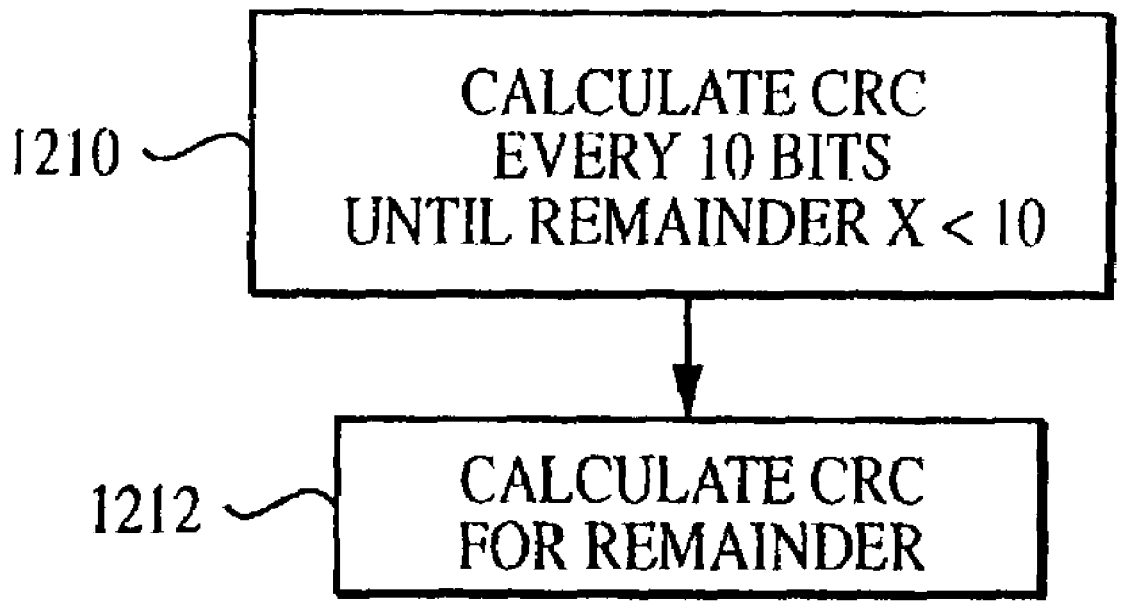
FIG. 12 is a diagram showing the CRC generation process based on a 10 bit symbol, used in the present invention.

The CRC generation process based on 10 bit symbols is shown in FIG. 12. Since the error correction code uses 10 bit symbols, then the CRC calculation is made for every 10 bit symbol until the remainder X is less than 10, at step 1210, similar to FIG. 5C. By calculating the CRC value in this manner, the sector can be any desired size. The CRC for the remainder is calculated based on a "two-bit shift" or on the basis of single bit shifts, in step 1212. Thus, if the remainder X is 4, 8, 2 or 6, the number of two-bit shifts required to process the remainder would be 2, 4, 1 and 3, respectively. In the alternative, a single 4-bit shift, a single 8-bit shift, a single 2-bit shift or a single 6-bit shift could be done for the remainder, if preferred. Another alternative is to perform a suitable number of 1-bit shifts.

While the principles of the invention have been described above in connection with specific apparatus and applications, it is to be understood that this description is made only by way of example and not as a limitation on the scope of the invention.

What is claimed is:

1. A method for reading data from a non-volatile data storage medium, the data being organized in sectors having some predetermined number of bits, comprising the steps of:
   reading a sector from the medium and storing the sector data in volatile memory,
   using a first algorithm, operated on the basis of a first bit length, to generate check bits based on the sector data, the check bits being stored in the volatile memory, and
   detecting and identifying at least some errors in the data using a second algorithm that operates on the basis of symbols having a second bit length,
   wherein the data and check bits stored in the volatile memory do not change if no errors are found, but if errors are found,
   using the second algorithm to correct the data stored in the volatile memory, and
   using the first algorithm, operated on the basis of the second bit length, to correct the check bits stored in the volatile memory to reflect the error corrections,
   thus not requiring re-reading the sector from the volatile memory to correct the check bits stored in the volatile memory.

2. The method of claim 1 wherein selected sectors are read from the medium successively.

3. The method of claim 1 wherein the check bits are corrected without re-reading the sector by,
   generating a mask using the second algorithm, the mask including mask segments that include the erroneous data,
   executing the first algorithm on the mask segments, operated on the basis of the second bit length, and
   performing an XOR operation on the check bits calculated using the first algorithm operated on the basis of the first bit length, and the check bits generated by the first algorithm from the mask data,
   whereby correct check bits are stored in the volatile memory.

4. The method of claim 1, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a predetermined number of 2-bit shifts.

5. The method of claim 1, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a single multi-bit shift.

6. The method of claim 1, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a predetermined number of 1-bit shifts.

7. A magnetic disk drive comprising:
   a magnetic disk,
   at least one head for writing and reading data from and to the disk,
   a controller for sending and receiving data to and from a host, and
   a volatile staging memory for writing and reading data to and from the host, and to and from the disk, under the control of the controller,
   the data being organized in sectors each having some predetermined number of bits,
   the data being stored in the volatile staging memory as it is read from the disk,
   the controller using a first algorithm, operated on the basis of a first bit length, to generate check bits based on the sector data, the check bits being stored in the volatile memory,
   the controller detecting and identifying errors in the data using a second algorithm that operates on the basis of symbols having a second bit length,
   wherein the data stored in the volatile staging memory is sent to the host by the controller if no errors are found, but if errors are found,
   the controller uses the second algorithm to correct the data stored in the volatile storage staging memory, and
   the controller uses the first algorithm, operated on the basis of the second bit length, to correct the check bits stored in the volatile memory to reflect the error corrections,
   thus not requiring re-reading the sector from the volatile staging memory to correct the check bits stored in the volatile staging memory.

8. The apparatus of claim 7 wherein selected sectors are read from the disk successively.

9. The apparatus of claim 7 wherein the controller includes,
   means for generating a mask using the second algorithm, the mask including mask segments that include the erroneous data,
   executing the first algorithm on the mask segments, operated on the basis of the second bit length, and
   performing an XOR operation on the check bits calculated using the first algorithm operated on the basis of the first bit length, and the check bits generated by the first algorithm from the mask data,
   whereby correct check bits are stored in the volatile memory.

10. The apparatus of claim 7, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a predetermined number of 2-bit shifts.

11. The apparatus of claim 7, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a single multi-bit shift.

12. The apparatus of claim 7, wherein if the total number of bits is not evenly divisible by the second bit length, when the first algorithm is operated on the basis of the second bit length, a check bit calculation is made for every symbol until the remainder is less than the second bit length, CRC check bits then being calculated for the remainder based on a predetermined number of 1-bit shifts.

* * * * *